(12) United States Patent
Park et al.

(10) Patent No.: US 6,864,637 B2
(45) Date of Patent: Mar. 8, 2005

(54) ORGANIC ELECTRO LUMINESCENCE DEVICE AND METHOD FOR DRIVING THE SAME

(75) Inventors: Jae Yong Park, Ahnyang-shi (KR); Joon Kyu Park, Seoul (KR); Ock Hee Kim, Ahnyang-shi (KR)

(73) Assignee: LG. Phillips LCD Co., Ltd., Seoul (KR)

(*) Notice: Subject to any disclaimer, the term of this patent is extended or adjusted under 35 U.S.C. 154(b) by 28 days.

(21) Appl. No.: 10/607,204

(22) Filed: Jun. 27, 2003

(65) Prior Publication Data
US 2004/0004443 A1 Jan. 8, 2004

(30) Foreign Application Priority Data
Jul. 8, 2002 (KR) .................... 10-2002-0039470

(51) Int. Cl.[7] .................... G09G 3/10; H01L 27/01
(52) U.S. Cl. .................... 315/169.1; 315/169.3; 315/169.4; 257/350; 257/59
(58) Field of Search .................... 315/169.1, 169.3, 315/169.4, 224, 291, 169.2; 345/76, 82, 77, 204, 211

(56) References Cited
U.S. PATENT DOCUMENTS 6,246,180 B1 * 6/2001 Nishigaki ............ 315/169.3
6,693,388 B2 * 2/2004 Oomura ............... 315/169.3
6,730,966 B2 * 5/2004 Koyama ............... 257/350
6,756,740 B2 * 6/2004 Inukai ................. 315/169.3
2003/0164685 A1 * 9/2003 Inukai ................. 315/169.3

* cited by examiner

Primary Examiner—Don Wong
Assistant Examiner—Chuc Tran
(74) Attorney, Agent, or Firm—McKenna Long & Aldridge LLP

(57) ABSTRACT

An organic electro-luminescence device (OELD) according includes column lines, row lines crossing the column lines; cells formed at pixel areas defined between the column lines and the row lines; a first switching device for controlling a current applied to the cell in response to data voltages applied from the column lines; a second switching device connected in parallel with the first switching device to the cell for controlling a current applied to the cell in response to the data voltages; a third switching device for applying the data voltages from the column lines to the first and second switching devices in response to scan voltages applied from the row lines; and first and second capacitors for storing the data voltages transmitted by the third switching device while sustaining the charged data voltages for one frame period of the OELD.

61 Claims, 9 Drawing Sheets

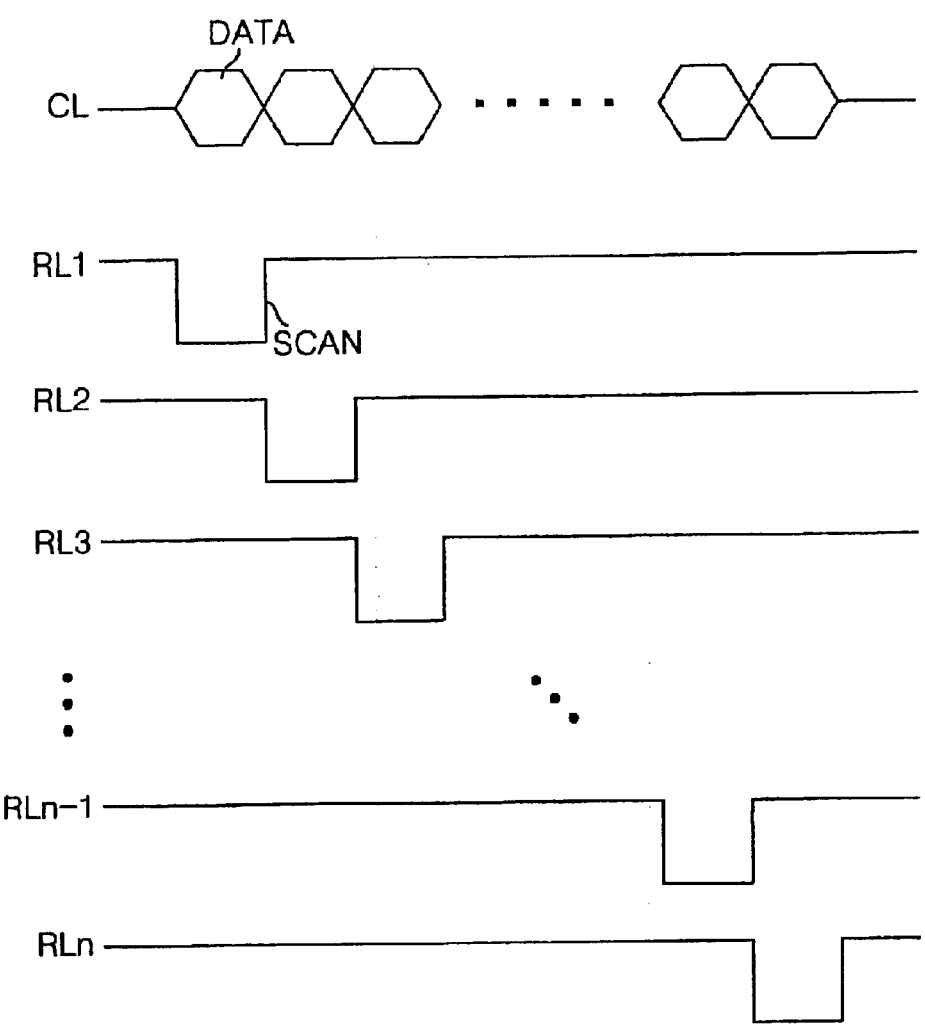

ORGANIC ELECTRO LUMINESCENCE DEVICE AND METHOD FOR DRIVING THE SAME

This application claims the benefit of Korean Patent Application No. P2002-39470 filed on Jul. 8, 2002, which is hereby incorporated by reference for all purposes as if fully set forth herein.

BACKGROUND OF THE INVENTION

1. Field of the Invention

The present invention relates to organic electro-luminescence devices, and more particularly to an organic electro-luminescence device and a method of driving the same wherein deterioration of a driving thin film transistor (TFT) is prevented.

2. Description of the Related Art

Until recently, cathode ray tubes (CRTs) have generally been used in display systems. However, use of newly developed flat panel displays such as liquid crystal displays (LCDs), field emission displays (FEDs), plasma display panels (PDPs), and electro-luminesence (EL) devices are becoming increasingly common due to their low weight, thin demensions, and low power consumption.

PDPs, being thin, lightweight, and having large display areas, are structurally simple and relatively easy to manu-facture. However, PDSs have relatively poor light emission characteristics causing the pictures they display to have a low brightness. Further, PDPs generally dissipate a large amount of power. Light emission characteristics of LCDs, on the other hand, are generally better than those of PDPs. However, LCDs having large display areas are difficult to fabricate LCDs because their manufacturing processes generally include those used in the semiconductor industry and are provided with a plurality of switching elements such as thin film transistors (TFTs). Accordingly, LCDs are generally used as display devices in notebook computers.

Depending on the type of material used as a light-emitting layer, EL devices are classifiable as inorganic EL devices or as organic EL devices. Generally, EL devices are self-luminous devices with excellent response speeds and light emission characteristics and are capable of displaying images at a high brightness and over wide ranges of viewing angles.

FIG. 1 illustrates cross-sectional view of a related art organic electro-luminescence device.

Referring to FIG. 1, organic EL devices generally include an anode electrode 2 made of a transparent, electrically conductive material patterned on a glass substrate 1, a hole injection layer 3 deposited over the anode electrode 2, a light emitting layer 4 deposited over the hole injection layer 3, an electron injection layer 5 deposited on the anode electrode 2, and a cathode electrode 6 deposited on the electron injection layer 5 and formed of a metallic material.

When a drive voltage is applied to the anode and cathode electrodes 2 and 6, holes in the hole injection layer 3, and electrons in the electron injection layer 5, migrate toward and excite the light emitting layer 4 to emit light in the visible wavelength range. Accordingly, pictures or images within the visible wavelength range can be displayed by the light emitting layer 4.

FIG. 2 illustrates a pixel arrangement in a related art organic electro-luminescence device. FIG. 3 illustrates an equivalent circuit diagram of the related art pixels of a first type within the organic electro-luminescence device shown in FIG. 2.

Referring to FIGS. 2 and 3, related art organic electro-luminescence devices (OELDs) generally include m number of column lines CL1 to CLm, n number of row lines RL1 to RLn, and m×n number of pixels P arranged in a matrix pattern defined by crossings of the column lines CL1 to CLm and the row lines RL1 to RLn. Within the related art OELD shown in FIG. 2, the number of column lines corresponds to the number of pixel signals for red, green, and blue colors is applied by the column lines CL1 to CLm. Further, each of the pixels P within the related art OELD includes switching devices such as a first TFT T1 provided as a p-type MOS-FET and formed at crossings of the column lines CL1 to CLm and row lines RL1 to RLn, a second TFT T2 (i.e., a driving TFT) provided as a p-type MOS-FET and formed between a cell drive voltage source VDD and an organic electro-luminescence cell for driving the electro-luminescence cell. Moreover, each pixel P includes a capacitor Cst connected between the first and second TFTs T1 and T2.

The first and second TFTs T1 and T2 each include source, drain, and gate terminals and may be turned on in response to a negative scan voltage applied from the row lines RL1 to RLn. When the first TFT T1 is turned on (i.e., when the first TFT T1 is maintaines in an ON state), an electrically conductive path is created between the source terminal and the drain terminal of the first TFT T1. When the voltage applied from the row lines RL1 to RLn is less than a threshold voltage Vth of the first TFT T1, the first TFT T1 is turned off (i.e., the first TFT T1 is maintained in an OFF state) and the electrically conductive path ceases to exist. While the first TFT T1 is maintained in the ON state, a data voltage DATA applied from a corresponding one of the column lines CL is applied to the gate terminal of the second TFT T2 via the first TFT T1. When the first TFT T1 is maintained in the OFF state, the data voltage DATA cannot not be applied to the second TFT T2.

Accordingly, the second TFT T2 controls a current conducted between its source and drain terminals in accordance with the data voltage DATA applied to its gate terminal to cause the electro-luminescence cell to emit light, wherein the brightness to which the light is emitted corresponds to the data voltage DATA.

The capacitor Cst stores a voltage equal to the voltage difference between the data voltage DATA and the cell drive voltage VDD. Accordingly, the capacitor Cst causes the voltage applied to the gate terminal of the second TFT T2 to be uniformly maintained during one frame period of the OELD while the current is uniformly applied to the electro-luminescence cell during the one frame period.

FIG. 4 illustrates scan and data voltage waveforms applied to the related art organic electro-luminescence device shown in FIGS. 2 and 3.

Referring to FIG. 4, scan pulses SCAN having a negative scan voltage are sequentially applied to the plurality of row lines RL1 to RLn while data voltages DATA are simultaneously applied to each of the plurality of column lines CL1 to CLm in synchrony with the application of each of the scan pulses SCAN. Accordingly, the data voltage DATA is transmitted by the first TFT T1 and is charged in the capacitor Cst.

FIG. 5 illustrates an equivalent circuit diagram of the related art pixels of a second type within the organic electro-luminescence device shown in FIG. 2.

Referring to FIGS. 2 and 5, related art OELD also generally include m number of column lines CL1 to CLm, n number of row lines RL1 to RLn, and m×n number of pixels P arranged in a matrix pattern defined by the crossings of the column lines CL1 to CLm and the row lines RL1 to RLn. Within the related art OELD shown in FIG. 2, the number of column lines corresponds to the number of pixel signals for red, green, and blue colors is applied by the column lines CL1 to CLm. Further, each of the pixels P within the related art OELD includes switching devices such as a first TFT T1 (i.e., a driving TFT) formed between the cell drive voltage source VDD and the electro-luminescence cell to drive the electro-luminescence cell; a second TFT T2 connected to the cell drive voltage source VDD to form a current mirror with the first TFT T1; a third TFT T3 connected between the second TFT T2, the column line CL, and the row line RL, to respond to a signal applied from the row line RL; a fourth TFT T4 connected between the gate terminals of the first TFT T1, the second TFT T2, the row line RL, and the third TFT T3. Moreover, each pixel P includes a capacitor Cst connected between the gate terminals of the first and second TFTs T1 and T2 and the voltage supply line VDD. The first to fourth TFTs T1 to T4 are generally provided as p-type MOS-FETs.

The third and fourth TFTs T3 and T4 each include source, drain, and gate terminals and may be turned on in response to a negative scan voltage applied from the row lines RL1 to RLn. When the third and fourth TFTs T3 and T4 are turned on, (i.e., when the third and fourth TFTs T4 and T5 are maintained in an ON state), electrically conductive paths are created between the source and drain terminals third and fourth TFTs T3 and T4. When the voltage applied from the row lines RL1 to RLn is less than a threshold voltage Vth of the third and fourth TFTs T3 and T4, the third and fourth TFTs T3 and T4 are turned off (i.e., third and fourth TFTs T3 and T4 are maintained in an OFF state) and the electrically conductive paths cease to exist. While the third and fourth TFTs T3 and T4 are maintained the ON state, the data voltage DATA applied from a corresponding one of the column lines CL is applied to the gate terminal of the first TFT T1 via the third and fourth TFTs T3 and T4. When the third and fourth TFTs T3 and T4 are maintained in the OFF state, data voltage DATA is not applied to the first TFT T1.

Accordingly, the first TFT T1 controls a current conducted between its source and drain terminals in accordance with the data voltage DATA applied to its gate terminal to cause the electro-luminescence cell to emit light, wherein the brightness to which the light is emitted corresponds to the data voltage DATA.

The second TFT T2 is provided as a current mirror of the first TFT T1 to uniformly control the current conducted from the first TFT T1 to the electro-luminescence cell.

The capacitor Cst stores a voltage equal to the voltage difference between the data voltage DATA and the cell drive voltage VDD. Accordingly, the capacitor Cst causes the voltage applied to the gate terminal of the first TFT T1 to be uniformly maintained during one frame period of the OLED while the current is uniformly applied to the electro-luminescence cell during the one frame period.

FIG. 6 illustrates scan and data voltage waveforms applied to the related art organic electro-luminescence device shown in FIGS. 2 and 5.

Referring to FIG. 6, scan pulses SCAN having a negative scan voltage are sequentially applied to the plurality of row lines RL1 to RLn while data voltages DATA are simultaneously applied to each of the plurality of column lines CL1 to CLm in synchrony with the application of each of the scan pulses SCAN. Accordingly, the data voltage DATA flows through the third and fourth TFTs T3 and T4 to be charged in the capacitor Cst. The data voltage DATA charged in the capacitor Cst is held for one frame period and controls the current path of the first TFT T1.

Generally, the cell drive voltage VDD is applied as a direct current (DC) voltage. Referring back to FIG. 3, the second TFT T2 is turned on differently from the first TFT T1. Accordingly, and upon applying the cell drive voltage VDD to the second TFT T2 of FIG. 3 (i.e., the driving TFT), the electro-luminescence cell is turned on and light is emitted. Referring now to FIG. 5, the first TFT T1 is turned on differently from the third and fourth TFTs T3 and T4. Accordingly, upon applying the cell drive voltage VDD to the first TFT T1 of FIG. 5 (i.e., the driving TFT), the electro-luminescence cell is turned on and light is emitted.

When driving the related art OELD of FIG. 2, the driving TFTs shown in FIGS. 3 and 5 (i.e., the second and first TFTs T2 and T1, respectively) become deteriorated due to a charge introduced by a silicon channel trapping phenomenon at an interface between a gate insulating film and a silicon layer of each of the driving TFT. Accordingly, current between the terminals of the first and second TFTs T1 and T2, controlled in accordance with the data voltage DATA applied thereto, becomes deleteriously and irreversibly affected, as shown in FIG. 7. Therefore, once electro-luminescence cells are turned off, current cannot be identically applied to turn the electro-luminescence cells back on. Consequently, residual images are generated within the pixels of the OELD device.

SUMMARY OF THE INVENTION

Accordingly, it is an object of the present invention to provide an organic electro-luminescence device that is adaptive for preventing the deterioration of a driving thin film transistor and a method of driving the same.

An advantage of the present invention provides an organic electro-luminescence device and a method of driving the same that substantially prevents residual images from being displayed as a result of deterioration of thin film transistors.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic electro-luminescence device according to the principles of a first aspect of the present invention may, for example, include column lines to which data voltages may be applied; row lines to which scan voltages may be applied, wherein the row lines cross the column lines; cells formed at pixel areas defined between the column lines and the row lines, wherein each cell may include a first switching device for controlling a current applied to the cell in response to the data voltage; a second switching device for controlling the current applied to the cell in response to the data voltage, wherein the second switching device is connected to the cell in parallel with the first switching device; a third switching device for transmitting the data voltage applied from a column line to the first and second switching devices in response to a scan voltage applied from a row line; and first and second capacitors for storing the data voltage via the third switching device while maintaining the data voltage for one frame period.

In one aspect of the present invention, the organic electro-luminescence device may further include cell drive voltage sources for applying the drive voltages to the cells.

In another aspect of the present invention, the cell drive voltage sources may, for example, include a first cell drive voltage source connected to each first switching device and a second cell drive voltage source connected to each second switching device.

In a further aspect of the present invention, the first and second cell drive voltages may be connected to the first and second switching devices, respectively.

In still another aspect of the present invention, the first capacitor may be connected between the third switching device and the first cell drive voltage source.

In yet another aspect of the present invention, the second capacitor may be connected between the third switching device and the second cell drive voltage source.

In still a further aspect of the present invention, the first and second cell drive voltage sources may alternately apply cell drive voltages over consecutive frames.

In yet another aspect of the present invention, the first to third switching devices may be provided as thin film transistors (TFTs).

In still another aspect of the present invention, the first to third switching devices may be provided as MOS TFTs.

In another aspect of the present invention, any of the first to third switching devices may be provided as amorphous silicon type TFTs or polycrystalline silicon type TFTs.

In one aspect of the present invention, the first to third switching devices may be provided as n-type MOS TFTs.

In another aspect of the present invention, the first to third switching devices may be provided as p-type MOS TFTs.

An organic electro-luminescence device according to the principles of a second aspect of the present invention may, for example, include first column lines to which first data voltages may be applied; second column lines to which second data voltages may be applied; row lines to which scan voltages may be applied, wherein the row lines cross the first and second column lines; cells formed at pixel areas defined between the first and second column lines and the row lines, wherein each cell may include a first switching device for controlling a current applied to the cell in response to the first data voltage; a second switching device for controlling a current applied to the cell in response to the second data voltage; a third switching device for transmitting the first data voltage applied from the first column line to the first switching device in response to a scan voltage applied from a row line; a fourth switching device for transmitting the second data voltage applied from the second column line to the first switching device in response to a scan voltage applied from a row line; a first capacitor for storing the first data voltage via the third switching device while maintaining the first data voltage for one frame period; and a second capacitor for storing the second data voltage via the fourth switching device while maintaining the second data voltage for one frame period.

In one aspect of the present invention, the data voltages may be alternately applied to the first and second column lines over consecutive frames.

The organic electro-luminescence device further includes a cell drive voltage source for applying a cell drive voltage to the cell.

In another aspect of the present invention, the first and second switching device may be connected in parallel between the drive voltage source and the cell.

In a further aspect of the present invention, the cell drive voltage source may be connected to source terminals of each of the first and second switching devices.

In still another aspect of the present invention, the first capacitor may be connected between the third switching device and the drive voltage source.

In yet another aspect of the present invention, the second capacitor may be connected between the fourth switching device and the drive voltage source.

In yet a further aspect of the present invention, the first to fourth switching devices may be provided as thin film transistors (TFTs).

In yet another aspect of the present invention, the first to fourth switching devices be provided as MOS TFTs.

In still another aspect of the present invention, any of the first to fourth switching devices may be provided as amorphous silicon type TFTs or polycrystalline silicon In another aspect of the present invention, the first to fourth switching devices may be provided as n-type MOS TFTs.

In one aspect of the present invention, the first to fourth switching devices may be provided as p-type MOS TFTs.

An organic electro-luminescence device according to the principles of a third aspect of the present invention may, for example, include column lines to which data voltages may be applied; row lines to which scan voltages may be applied, wherein the row lines cross the column lines; cells formed at pixel areas defined between the column lines and the row lines, wherein each cell may include a first switching device for controlling a current applied to the cell in response to the data voltage; a second switching device for controlling a current applied to the cell in response to the data voltage, wherein the second switching device is connected in parallel to the cell with the first switching device; a third switching device connected to form a current mirror with the first and second switching devices for uniformly maintaining the current; a fourth switching device for applying the data voltage from a column line to the first and second switching devices in response to a scan voltage in the row line; a fifth switching device connected between the fourth switching device and the first and second switching devices for applying the data voltage to each of the first and second switching devices via the fourth switching device; and first and second capacitors for storing the data voltage through the fourth and fifth switching devices while maintaining the data voltage during one frame period.

In one aspect of the present invention, the organic electro-luminescence device may further include cell drive voltage sources for applying cell drive voltages to the plurality of cells.

In another aspect of the present invention, the cell drive voltage sources may, for example, include a first cell drive voltage source connected to the first switching device; a second cell drive voltage source connected to the second switching device; and a third cell drive voltage source connected to the third switching device.

In a further aspect of the present invention, the first to third cell drive voltages may be connected to the first to third switching devices, respectively.

In still another aspect of the present invention, the first capacitor may be connected between the third switching device and the first cell drive voltage source.

In yet another aspect of the present invention, the second capacitor may be connected between the third switching device and the second cell drive voltage source.

In still a further aspect of the present invention, the first and second cell drive voltage sources may alternately apply cell drive voltages over consecutive frames.

In yet another aspect of the present invention, the first to third cell drive voltage sources may apply substantially the same cell drive voltage.

In still another aspect of the present invention, the first to fifth switching devices may be provided as thin film transistors (TFTs).

In another aspect of the present invention, the first to fifth switching devices may be provided as MOS TFTs.

In one aspect of the present invention, any of the first to fifth switching devices may be provided as amorphous silicon type TFTs or polycrystalline silicon type TFTs.

In another aspect of the present invention, the first to fifth switching devices may be provided as n-type MOS TFTs.

In still another aspect of the present invention, the first to fifth switching devices may be provided as p-type MOS TFTs.

In accordance with the principles of one aspect of the present invention, a method of driving an organic electro-luminescence device having column lines to which data voltages may be applied, row lines to which scan voltages may be applied, cells at pixel areas defined between the column lines and the row lines, first and second cell drive voltage sources for driving the cells in response to the data voltages, first switching devices for controlling a current applied to the cells in response to the data voltages, second switching devices connected in parallel with the first switching devices for controlling the current applied to the cells, and third switching devices for applying data voltages from the column lines to the first and second switching devices may, for example, include alternately applying cell drive voltages from the first and second cell drive voltage sources over consecutive periods; applying data voltages from the column lines; and applying scan voltages from the row lines in synchrony with the data voltages.

In one aspect of the present invention, the method of driving may further include applying the data voltages to first and second capacitors each installed between the third switching device and the first and second switching devices to charge the first and second capacitors and maintain the data voltages.

In another aspect of the present invention, the method of driving may further include causing cells to emit light in correspondence with the first and second cell drive voltages and the applied data voltage.

In still another aspect of the present invention, application of the first and second cell drive voltages may precede application of the data voltages.

In yet another aspect of the present invention, the first and second cell drive voltages may be alternately applied over consecutive frame periods.

In still a further aspect of the present invention, cells may emit light upon application of the data voltages and the alternate application of the first and second cell drive voltages over consecutive frame periods.

In one aspect of the present invention, light may be emitted by the cells by applying the data voltages charged by the first and second capacitors to the first and second switching devices; determining current path widths of the first and second switching devices using the applied data voltages; and applying the first and second cell drive voltages to the cells in accordance with current path widths for each cell.

In accordance with the principles of another aspect of the present invention, a method of driving of an organic electro-luminescence device having first column lines to which first data voltages may be applied, second column lines to which second data voltages may be applied, row lines to which scan voltages may be applied, cells at pixel areas defined between the first and second column lines and the row lines, first switching devices for controlling a current applied to the cells in response to the first data voltages, second switching devices for controlling a current applied to the cells in response to the second data voltages, third switching devices for applying the data voltages from the first column lines to corresponding ones of the first switching devices, and fourth switching devices for applying the data voltages from the second column lines to corresponding ones of the second switching devices may, for example, include alternately applying the first and second data voltages from the first and second column lines alternately over consecutive periods; and applying scan voltages from the row lines in synchrony with the first and second data voltages.

In one aspect of the present invention, the method of driving may further include applying the first data voltage to a first capacitor installed between the first switching device and the third switching device to charge the first capacitor and maintain the first data voltage; and applying the second data voltage to a second capacitor installed between the second switching device and the fourth switching device to charge the second capacitor and maintain the second data voltage.

In another aspect of the present invention, the method of driving may further include causing cell to emit light in correspondence with the applied first and second data voltages and an externally applied cell drive voltage.

In still another aspect of the present invention, the first and second data voltages may be alternately applied over consecutive frame periods.

In yet another aspect of the present in invention, the cells may emit light in accordance with the cell drive voltage and the alternately applied first and second data voltages.

In still a further aspect of the present invention, light may be emitted by the cells by applying the first and second data voltages charged by the first and second capacitors to the first and second switching devices; determining current path widths of the first and second switching devices using the applied first and second data voltages; and applying the cell drive voltage to the cells in accordance with the current path widths for each cell.

In accordance with the principles of yet another aspect of the present invention, a method of driving of an organic electro-luminescence device having column lines to which data voltages may be applied, row lines to which scan voltages may be applied, cells at pixel areas defined between the column lines and the row lines, first to third cell drive voltage sources for driving the cells in response to the data voltages, first switching devices for controlling a current applied to the cells in response to the data voltages, second switching devices connected in parallel with corresponding ones of the first switching devices for controlling a current applied to the cells, third switching devices for forming current mirrors with the first and second switching devices, and fourth and fifth switching devices connected in series to each other for applying data voltages from the column lines to the first and second switching devices, may for example, include alternately applying first and second cell drive voltages from the first and second cell drive voltage sources over consecutive periods; applying the data voltages from the column lines; applying scan voltages from the row lines in synchrony with the data voltages; and applying a third cell drive voltage from the third cell drive voltage sources in synchrony with the data voltages.

In one aspect of the present invention, the method of driving may further include applying the data voltage to first and second capacitors each installed between the third switching device and the first and second switching devices to charge the first and second capacitors and maintain the data voltages.

In another aspect of the present invention, the method of driving may further include causing the cells to emit light in correspondence with the first and second cell drive voltages and the applied data voltages.

In still another aspect of the present invention, application of the first and second cell drive voltages may precede application of the data voltages.

In yet another aspect of the present invention, the first and second cell drive voltages may be alternately applied over consecutive frame periods.

In still a further aspect of the present invention, the first to third cell drive voltages may be substantially identical in magnitude.

In yet another aspect of the present invention, cells may emit light upon application of the data voltages and the first and second cell drive voltages, alternately applied for each frame.

In one aspect of the present invention, light may be emitted by the cells by applying the data voltages charged by the first and second capacitors to the first and second switching devices; determining current path widths of the first and second switching devices using the applied data voltages; and applying the first and second cell drive voltages to the cells in accordance with current path widths for each cell.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4 illustrates scan and data voltage waveforms applied to the related an organic electro-luminescence device shown in FIGS. 2 and 3;

DETAILED DESCRIPTION OF THE ILLUSTRATED EMBODIMENTS

Reference will now be made in detail to embodiments of the present invention, examples of which are illustrated in the accompanying drawings.

Figure 1:
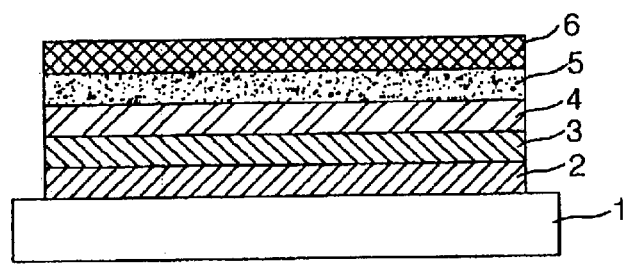
FIG. 1 illustrates cross-sectional view of a related art organic electro-luminescence device.
Figure 3:
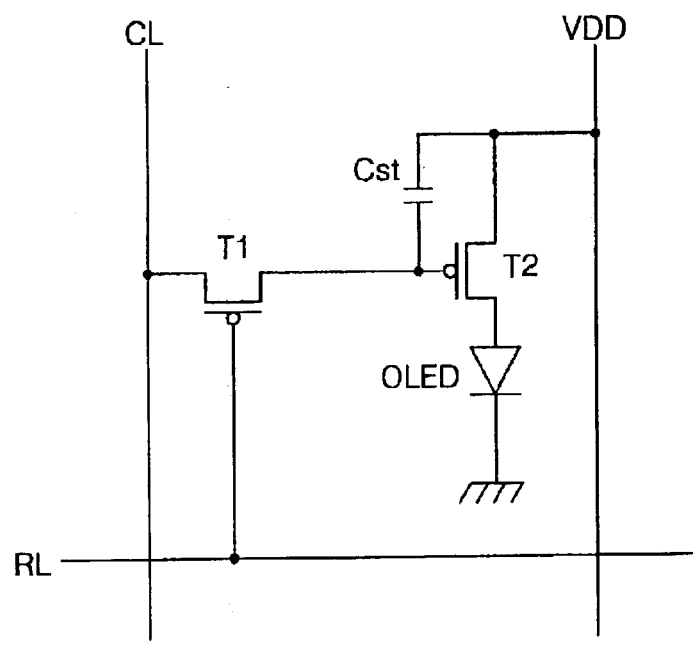
FIG. 3 illustrates an equivalent circuit diagram of the related art pixels of a first type within the organic electro-luminescence device shown in FIG. 2.
Figure 2:
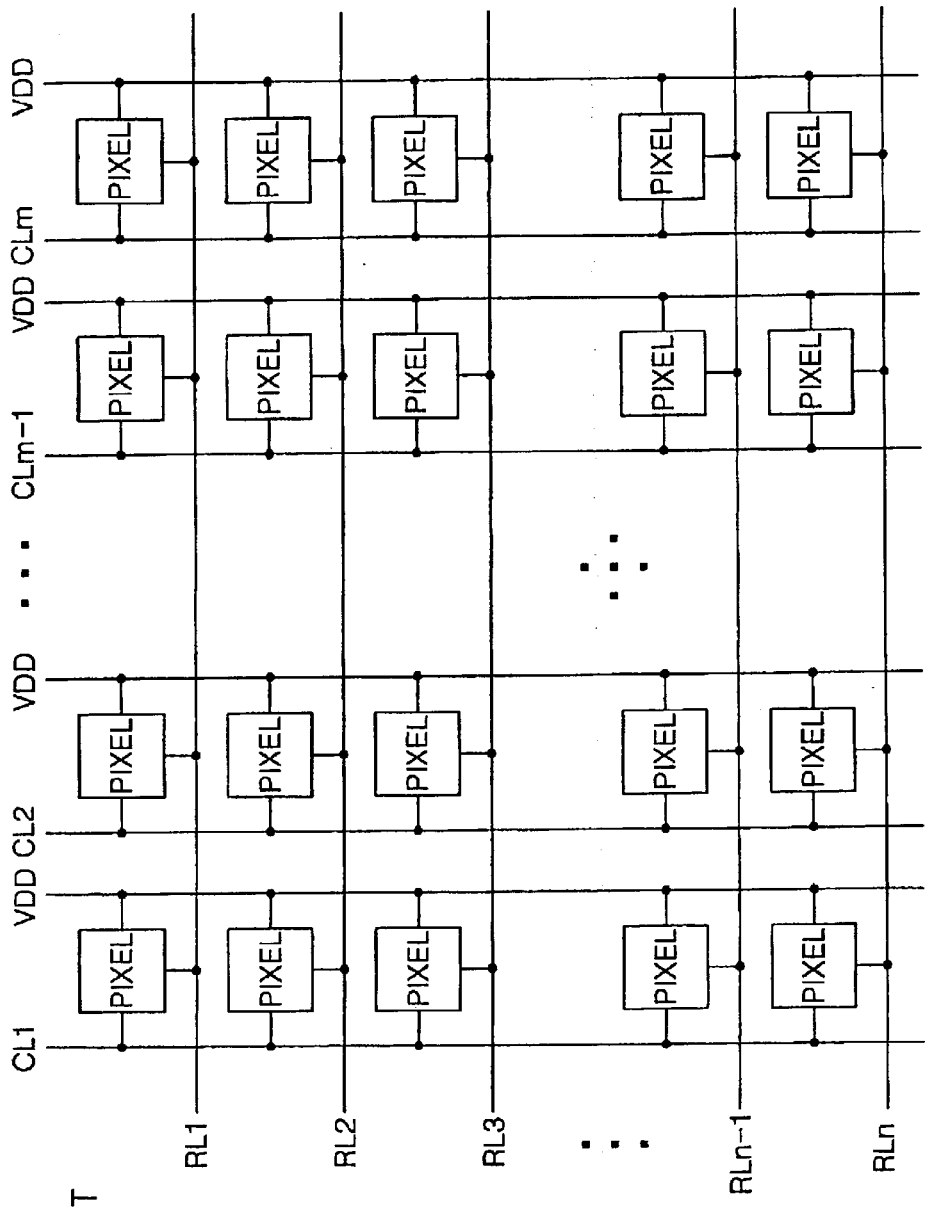
FIG. 2 illustrates a pixel arrangement in a related art organic electro-luminesence device.
Figure 5:
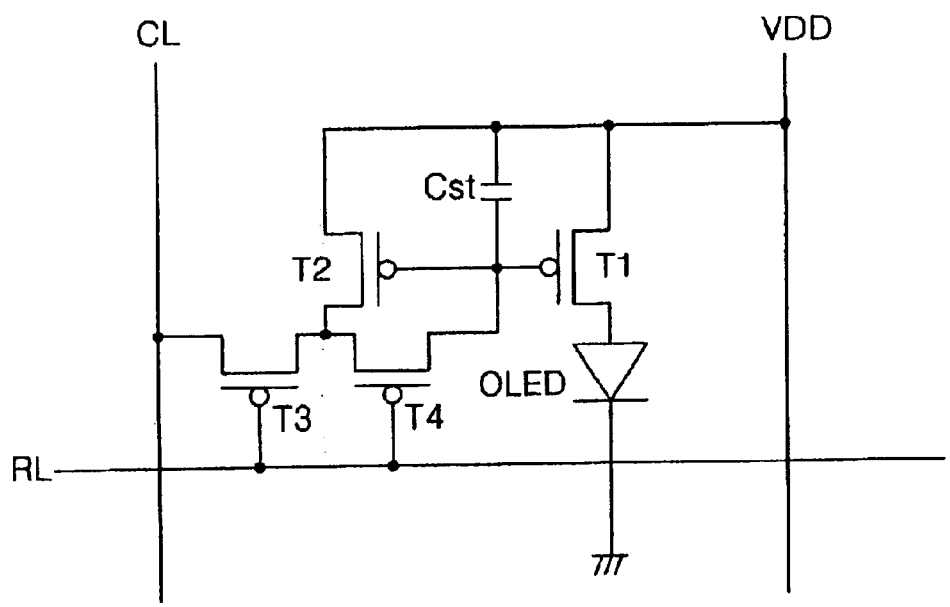
FIG. 5 illustrates an equivalent circuit diagram of the related art pixels of a second type within the organic electro-luminescence device shown in FIG. 2.
Figure 7:
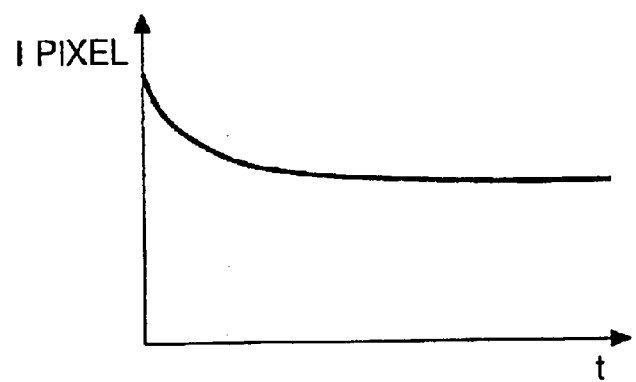
FIG. 7 illustrates the time-dependent deterioration of a cell drive current within pixels of the related art electro-luminescence cell shown in FIGS. 3 and 5.
Figure 6:
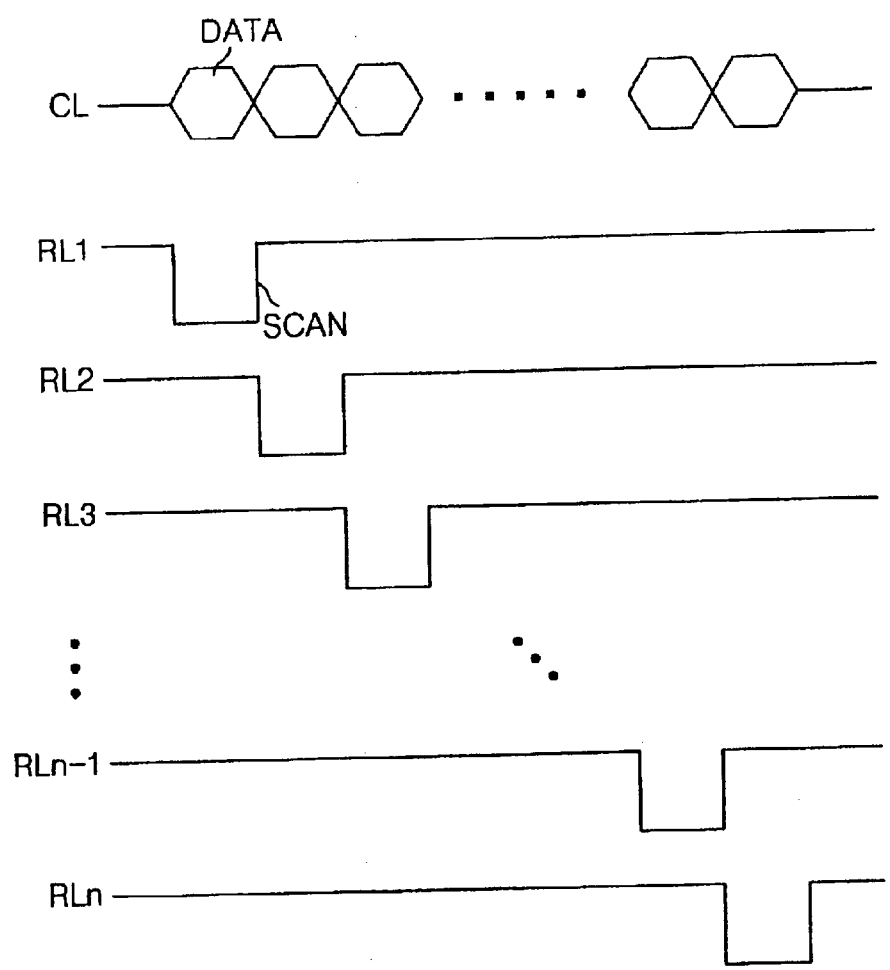
FIG. 6 illustrates scan and data voltage waveforms applied to the related art organic electro-luminescence device shown in FIGS. 2 and 5.
Figure 8:
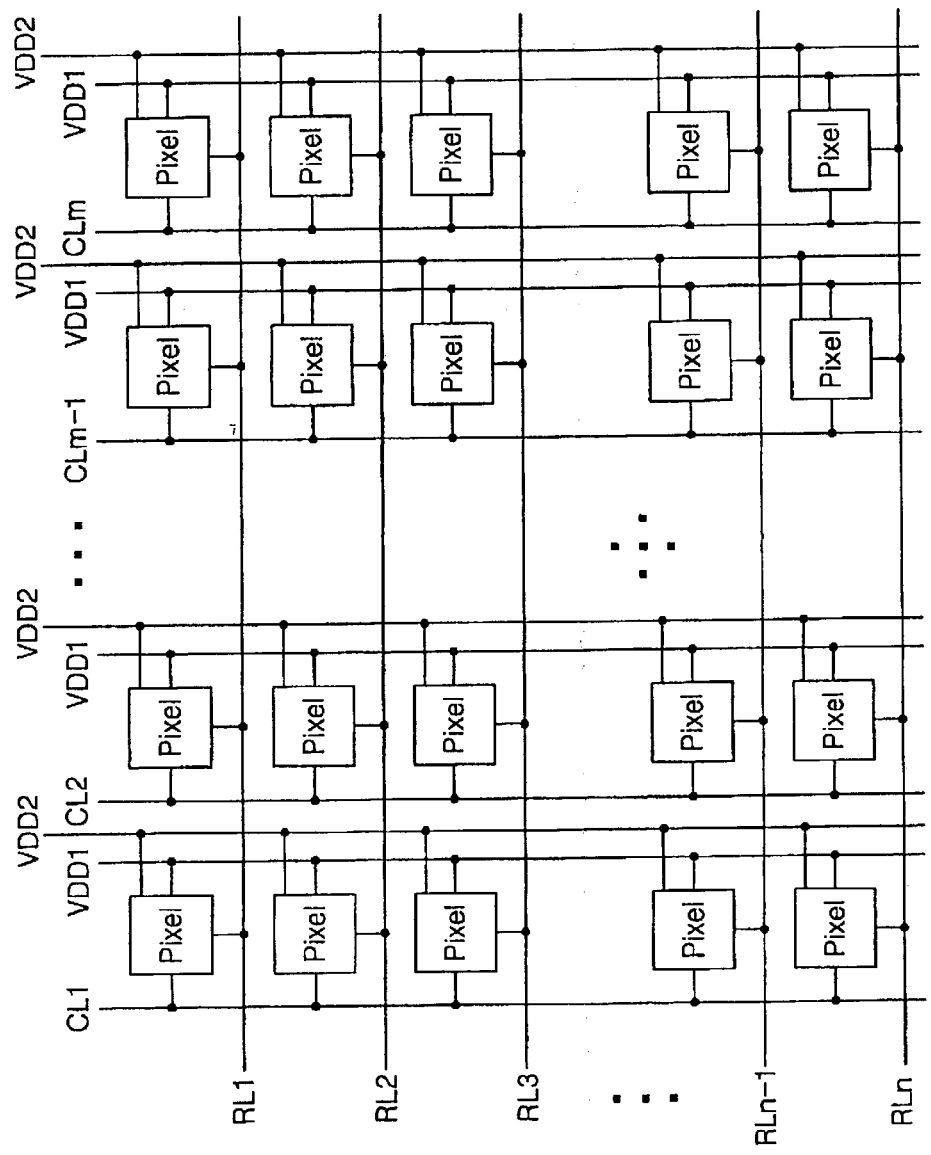
FIG. 8 illustrates a pixel arrangement in an organic electro-luminescence device according to a first aspect of the present invention.

FIG. 8 illustrates a pixel arrangement in an organic electro-luminescence device according to a first aspect of the present invention and illustrates an equivalent circuit diagram of the pixels within the organic electro-luminescence device shown in FIG. 8, in accordance with the first aspect of the present invention.

Figure 9:
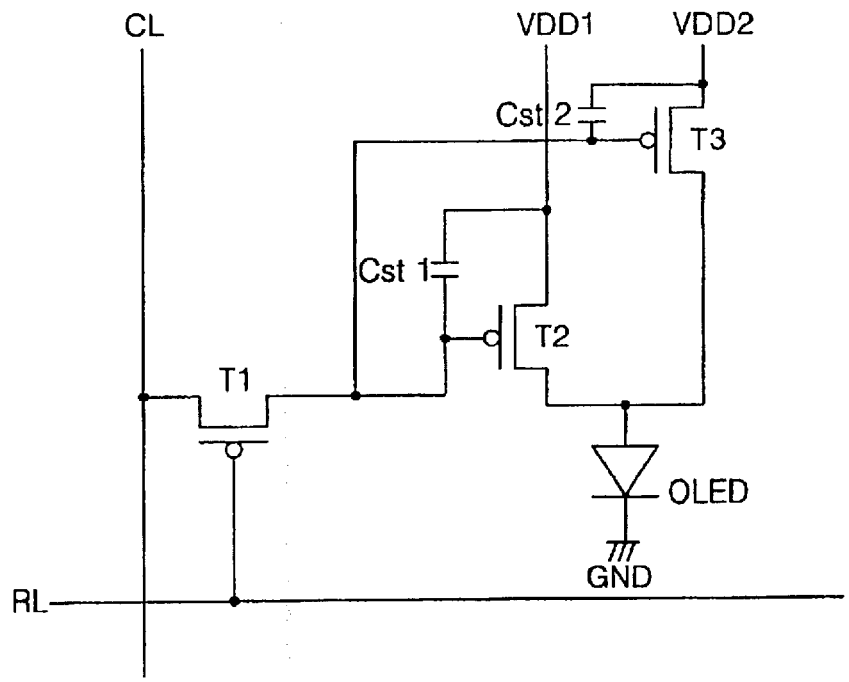
FIG. 9 illustrates an equivalent circuit diagram of the pixels within the organic electro-luminescence device shown in FIG. 8, in accordance with the first aspect of the present invention.

Referring to FIGS. 8 and 9, the organic electro-luminescence device (OELD) according to a first aspect of the present invention may, for example, include m number of column lines CL1 to CLm, n number of row lines RL1 to RLn, and m×n number of pixels P arranged in a matrix pattern defined by the crossings of the column lines CL1 to CLm and the row lines RL1 to RLn.

Further, and in accordance with the principles of the first aspect of the present invention, the OELD may, for example, include a cell drive voltage source. In one aspect of the present invention, the cell drive voltage source may, for example, include a first cell drive voltage source VDD1 for applying a first cell drive voltage and a second cell drive voltage source VDD2 for applying a second cell drive voltage.

Referring to FIG. 9, and in accordance with the principles of the first aspect of present invention, each of the pixels P within the OELD may, for example, include switching devices such as a first TFT T1 formed at a crossing of the column line CL and row line RL; a second TFT T2 (e.g., a first driving TFT) formed between the first cell drive voltage source VDD1 and a electro-luminescence cell for driving the electro-luminescence cell; and a third TFT T3 (e.g., a second driving TFT) formed between the second cell drive voltage source VDD2 and the electro-luminescence cell for driving the electro-luminescence cell. Further, each of the pixels P within the OELD may include a first capacitor Cst1 connected between the first and second TFTs T1 and T2 and a second capacitor Cst2 connected between the first and third TFTs T1 and T3.

According to the principles of the present invention, any of the first to third TFTs T1 to T3 may include amorphous silicon (a-Si) or polycrystalline silicon (p-Si). Further, the first to third TFTs T1 to T3 may be provided as p-type or n-type MOS-FET type TFTs. For example, the first to third TFTs T1 to T3 shown in FIG. 9 may be provided as p-type TFTs. According to the principles of the present invention, the first and second cell drive voltage sources VDD1 and VDD2 may each be connected to an external voltage supply for being alternately driven over consecutive frames of the OELD.

According to the principles of the present invention, the first TFT T1 may include source, drain, and gate terminals and may be turned on in response to a negative scan voltage applied from the row lines RL1 to RLn. When the first TFT T1 is turned on (i.e., when the first TFT T1 is maintained in an ON state), an electrically conductive path may be created between the source terminal and the drain terminal. When the voltage applied from the row lines RL1 to RLn is less than a threshold voltage Vth of the first TFT T1, the first TFT T1 may be turned off (i.e., the first TFT T1 is maintained in an OFF state) and the electrically conductive path ceases to exist. While the first TFT T1 is maintained in the ON state, the data voltage DATA applied from the column lines CL may be applied through the first TFT T1 to a gate terminal of the second TFT T2 and to a gate terminal of the third TFT T3. However, when the first TFT T1 is maintained in the OFF state, the data voltage DATA may not be applied to either the second or third TFT T2 or T3.

According to the principles of the present invention, the amount of current conducted between source and drain terminals of the second TFT T2 to the electro-luminance cell may be varied in accordance with the data voltage DATA applied to the gate terminal of the second TFT T2. Accordingly, data voltage DATA may control the degree to which the second TFT T2 applies a first cell drive voltage from the first cell drive voltage source VDD1 to the electro-luminescence cell. As a result, the electro-luminescence cells may emit light to a predetermined brightness in accordance with the data voltage DATA.

According to the principles of the present invention, the first capacitor Cst1 may store a voltage substantially equal to a voltage difference between the data voltage DATA and the first cell drive voltage VDD1 to cause the voltage applied to the gate terminal of the second TFT T2 to be substantially uniformly maintained during one frame period of the OELD while the current is uniformly applied to the electro-luminescence cell during the one frame period.

According to the principles of the present invention, the amount of current conducted between source and drain terminals of the third TFT T3 to the electro-luminance cell may be controlled in accordance with the data voltage DATA applied to the gate terminal of the third TFT T3. Accordingly, the data voltage DATA may control the degree to which the third TFT T3 applies a second cell drive voltage from the second cell drive voltage source VDD2 to the electro-luminescence cell. As a result, the electro-luminescence cells may emit light to a predetermined brightness in accordance with the data voltage DATA.

According to the principles of the present invention, the second capacitor Cst2 may store a voltage substantially equal to a voltage difference between the data voltage DATA and the second cell drive voltage VDD2 to cause the voltage applied to the gate terminal of the third TFT T3 to be substantially uniformly maintained during one frame period of the OELD while the current is uniformly applied to the electro-luminescence cell during the one frame period.

Figure 10:
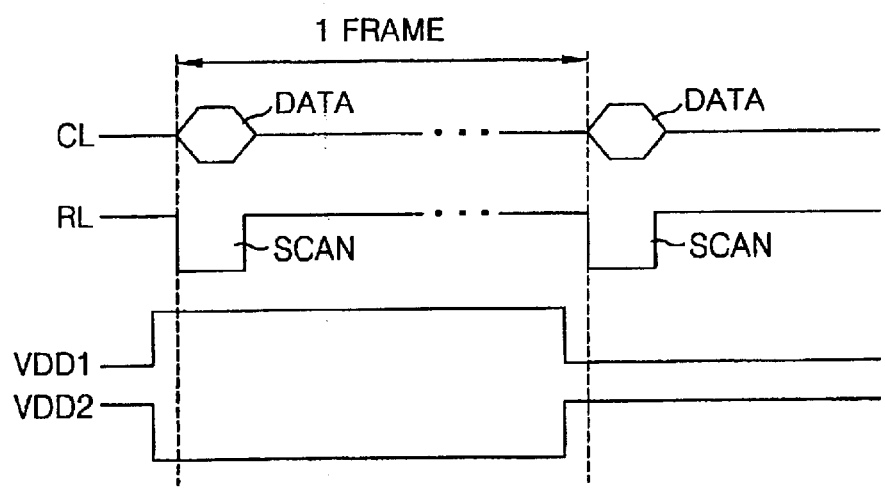
FIG. 10 illustrates scan and data voltage waveforms applied to the electro-luminesence device shown in FIGS. 8 and 9.

FIG. 10 illustrates scan and data voltage waveforms applied to the electro-luminescence device shown in FIGS. 8 and 9.

Referring to FIG. 10, scan pulses SCAN having a negative scan voltage may be sequentially applied to the plurality of row lines RL1 to RLn. Further, the data voltages DATA may be simultaneously applied to each of the plurality of column lines CL1 to CLm in synchrony with the application of each scan pulse SCAN. Accordingly, in each frame, the data voltages DATA may be transmitted through the first TFT T1 and charged within the first and second capacitors Cst1 and Cst2. As mentioned above, the first and second capacitors Cst1 and Cst2 may store voltages equal to the voltage differences between the data voltage DATA and the first and second cell drive voltages VDD1 and VDD2, respectively. Therefore, voltages applied to the gate terminals of the second and third TFT T2 and T3 may be substantially uniformly maintained during one frame period while the current is uniformly applied to the electro-luminescence cell during the one frame period.

In one aspect of the present invention, the first and second cell drive voltage sources VDD1 and VDD2 may be connected to respective ones of the source terminals of the second and third TFTs T2 and T3 and may be alternately driven over consecutive frames. Accordingly, the second and third TFTs T2 and T3 may apply first and second cell drive voltages VDD1 and VDD2 to the electro-luminescence cell, causing the electro-luminescence cell to emit light during consecutive frames. The first and second cell drive voltages may be applied from the first and second cell drive voltage sources VDD1 and VDD2, respectively, before scan pulses SCAN and data voltages DATA are applied from the column lines CL and row lines RL. Accordingly, the electro-luminescence cell may emit light in response to the first and second cell drive voltages VDD1 and VDD2, alternately applied over consecutive frames.

Referring still to FIG. 8, the number of column lines CL provided within the OELD may correspond to the number of red (R), green (G), and blue (B) pixel signals that are inputted. In one aspect of the present invention, light emitted from the electro-luminescence cells can be displayed at both an upper and a lower part of the OELD.

Figure 11:
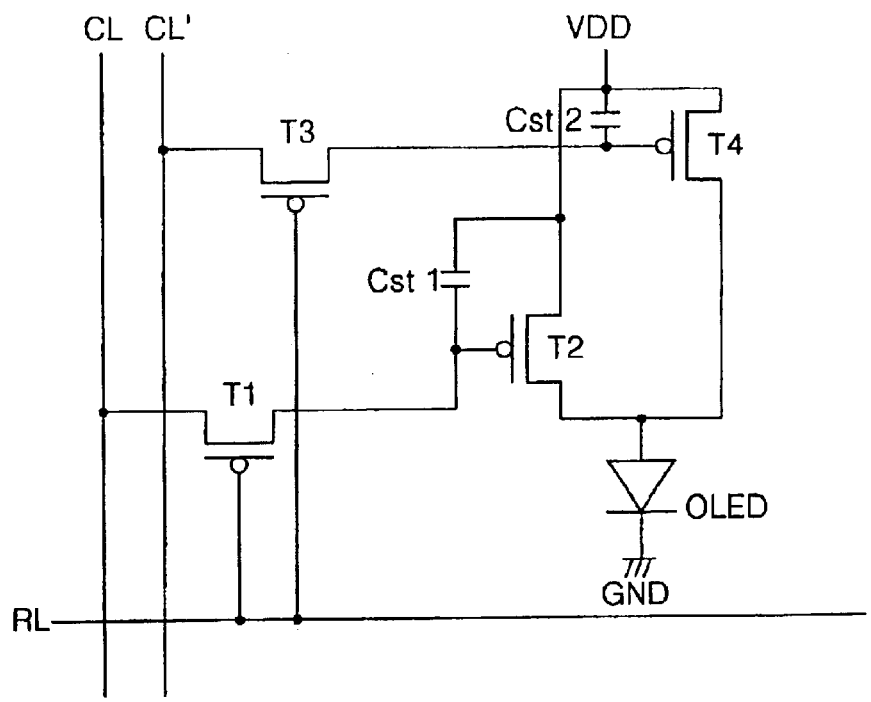
FIG. 11 illustrates an equivalent circuit diagram of the pixels within an organic electro-luminescence device in accordance with a second aspect of the present invention.

FIG. 11 illustrates an equivalent circuit diagram of the pixels within an organic electro-luminescence device in accordance with a second aspect of the present invention.

Referring to FIG. 11, and in accordance with the principles of the second aspect of the present invention, the OELD may generally be provided substantially as the OELD shown in FIGS. 8 and 9 but may include m number of pairs of first column lines CL1 to CLm and second column lines CL1' to CLm', alternately arranged within the OELD with respect to each other. Further, the OELD may include only a single cell drive voltage source VDD. The first and second column lines CLm and CLm', respectively, may cross n number of row lines RL1 to RLn and m×n number of pixels may be arranged in a matrix pattern defined by the crossings of the first and second column lines CL1 to CLm and CL1' to CLm' and the row lines RL1 to RLn. According to the principles of the present invention, each of m pairs of the first column lines CL1 to CLm and the second column lines CL1' to CLm' constitutes a pixel.

In accordance with the second aspect of the present invention, each pixel within the OELD may, for example, include switching devices such as a first TFT T1 formed at a crossing of the first column line CL and the row line RL; a second TFT T2 (e.g., a first driving TFT) formed between a cell drive voltage source VDD and a electro-luminescence cell for driving the electro-luminescence cell; a third TFT T3 formed at a crossing of second column line CL' and the row line RL; and a fourth TFT T4 (e.g., a second driving TFT) formed between the cell drive voltage source VDD and the electro-luminescence cell for driving the electro-luminescence cell. In one aspect of the present invention, the second and fourth TFTs T2 and T4 may be connected in parallel between the cell drive voltage source VDD and the electro-luminescence cell. Further, each pixel within the OELD may include a first capacitor Cst1 connected between the cell drive voltage source VDD and a node arranged between the first and second TFTs T1 and T2 and a second capacitor Cst2 connected between the cell drive voltage source VDD and a node arranged between the third and fourth TFTs T3 and T4.

According to the principles of the present invention, any of the first to fourth TFTs T1 to T4 may include amorphous silicon (a-Si) or polycrystalline silicon (p-Si). Further, the first to fourth TFTs T1 to T4 may be provided as p-type or n-type MOS-FET type TFTs. For example, the first to fourth TFTs T1 to T4 shown in FIG. 11 may be provided as p-type TFTs.

According to the principles of the present invention, the first and third TFTs T1 and T3 may include source, drain, and gate terminals and may be turned on in response to a negative scan voltage applied from the row lines RL1 to RLn. When the first and third TFTs T1 and T3 are turned on (i.e., when the first and third TFTs T1 and T3 are maintained in on ON state), electrically conductive paths may be created between the source terminals and corresponding ones of the drain terminals of each of the TFTs. When the voltage applied from the row lines RL1 to RLn is less than a threshold voltage Vth of the first and third TFTs T1 and T3, the first and third TFTs T1 and T3 are turned off (i.e., the first and third TFTs T1 and T3 are maintained in an OFF state) and the electrically conductive paths described above ceases to exist.

In one aspect of the present invention, when the first and third TFTs T1 and T3 are maintained in their ON states, a first data voltage DATA1, applied from the first column lines CL, may be transmitted through the first TFT T1 to a gate terminal of the second TFT T2. Moreover, when the first data voltage DATA1 is applied from the first column lines CL, a second data voltage DATA2 is not applied to the second column lines CL'. When the first and third TFTs T1 and T3 are maintained in their OFF states, the first data voltage DATA1 on the first column lines CL is not applied to either the second or fourth TFTs T2 or T4. Further, when the first and third TFTs T1 and T3 are maintained in their OFF states, and when the first data voltage DATA1 is applied to the first column lines CL, the second data voltage DATA2 is not applied to the second column lines CL'.

In another aspect of the present invention, when the first and third TFTs T1 and T3 are maintained in their ON states, the second data voltage DATA2, applied from the second column lines CL', may be transmitted through the third TFT T3 to a gate terminal of the fourth TFT T4. Moreover, when the second data voltage DATA2 is applied from the second column lines CL', the first data voltage DATA1 is not applied to the first column lines CL. When the third and third TFTs T1 and T3 are maintained in their OFF states, the second data voltage DATA2 on the second column lines CL' is not applied to the second or fourth TFTs T2 or T4. Further, when the first and third TFTs T1 and T3 are maintained in their OFF states, and when the second data voltage DATA2 is applied to the second column lines CL', the first data voltage DATA1 is not applied to the first column lines CL.

According to the principles of the present invention, the amount of current conducted between source and drain terminals of the second and fourth TFTs T2 and T4 to the electro-luminance cell may be varied in accordance with the first and second data voltages DATA1 and DATA2, respectively, applied to the gate terminals of the second and fourth TFTs T2 and T4, respectively. Accordingly, first and second data voltages DATA1 and DATA2, respectively, may control the degree to which the second and fourth TFTs T2 and T4 apply cell drive voltages from the cell drive voltage source VDD to the electro-luminescence cell. As a result, the electro-luminescence cells may emit light to a predetermined brightness in accordance with the first and second data voltages DATA1 and DATA2. According to the principles of the present invention, the first and second data voltages DATA1 and DATA2 may be alternately applied from the first and second column lines CL and CL' over consecutive frames. Accordingly, the second and fourth TFTs T2 and T4 may cause the electro-luminescence cells to alternately emit light in response to the first and second data voltages DATA1 and DATA2.

According to the principles of the present invention, the first capacitor Cst1 may store a voltage substantially equal to a voltage difference between the first data voltage DATA1 and the cell drive voltage VDD to cause the voltage applied to the gate terminal of the second TFT T2 to be substantially uniformly maintained during one frame period of the OELD while the current is uniformly applied to the electro-luminescence cell during the one frame period.

According to the principles of the present invention, the second capacitor Cst2 may store a voltage substantially equal to a voltage difference between the second data voltage DATA2 and the cell drive voltage VDD to cause the voltage applied to the gate terminal of the fourth TFT T4 to be substantially uniformly maintained during one frame period of the OELD while the current is uniformly applied to the electro-luminescence cell during the one frame period.

Figure 12:
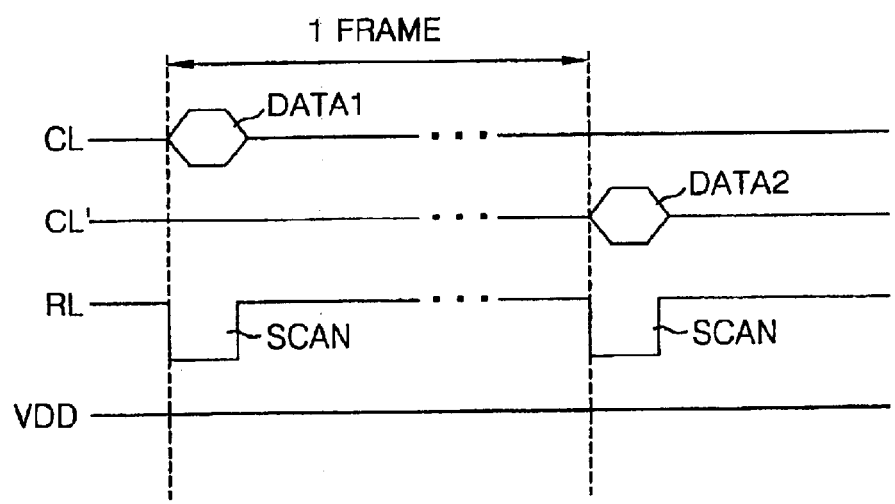
FIG. 12 illustrates scan and data voltage waveforms applied to the electro-luminescence device shown in FIG. 11.

FIG. 12 illustrates scan and data voltage waveforms applied to the electro-luminescence device shown in FIG. 11.

Referring to FIG. 12, scan pulses SCAN having a negative scan voltage may be sequentially applied to the plurality of row lines RL1 to RLn while first and second data voltages DATA1 and DATA2 may be simultaneously applied to corresponding ones of the first and second column lines CL1 to CLm and CL'1 to CL'm. Further, the first and second data voltages DATA1 and DATA2 may be alternately applied to corresponding ones of the first and second column lines CL and CL' in synchrony with the application of each scan pulse SCAN. Accordingly, in consecutive frames, the first and second data voltages DATA1 and DATA2 may be alternately transmitted through the first and third TFTs T1 and T3, respectively, and charged within the first and second capacitors Cst1 and Cst2. The first and second capacitors Cst1 and Cst2 store voltages equal to the voltage differences voltage between the first and second data voltages DATA1 and DATA2, respectively. Therefore, the cell drive voltage VDD applied to the gate terminals of the second and fourth TFTs T2 and T4 may be substantially uniformly maintained during one frame period while the current is uniformly applied to the electro-luminescence cell during the one frame period.

In one aspect of the present invention, the cell drive voltage source VDD, connected to the source terminals of both the second and fourth TFTs T2 and T4, may apply the cell drive voltage VDD to the electro-luminescence cell during each frame in conjunction with the first and second data voltages DATA1 and DATA2, alternately applied to the first and second column line CL and CL'. Accordingly, each of the second and fourth TFTs T2 and T4 may apply the cell drive voltage VDD to the electro-luminescence cell, causing the electro-luminescence cell to emit light during consecutive frames.

In another aspect of the present invention, the number of each of the first and second column lines CL and CL' provided within the OELD may correspond to the number of red (R), green (G), and blue (B) pixel signals that are inputted. In one aspect of the present invention, light emitted from the electro-luminescence cells can be displayed at both an upper and a lower part of the OELD.

Figure 13:
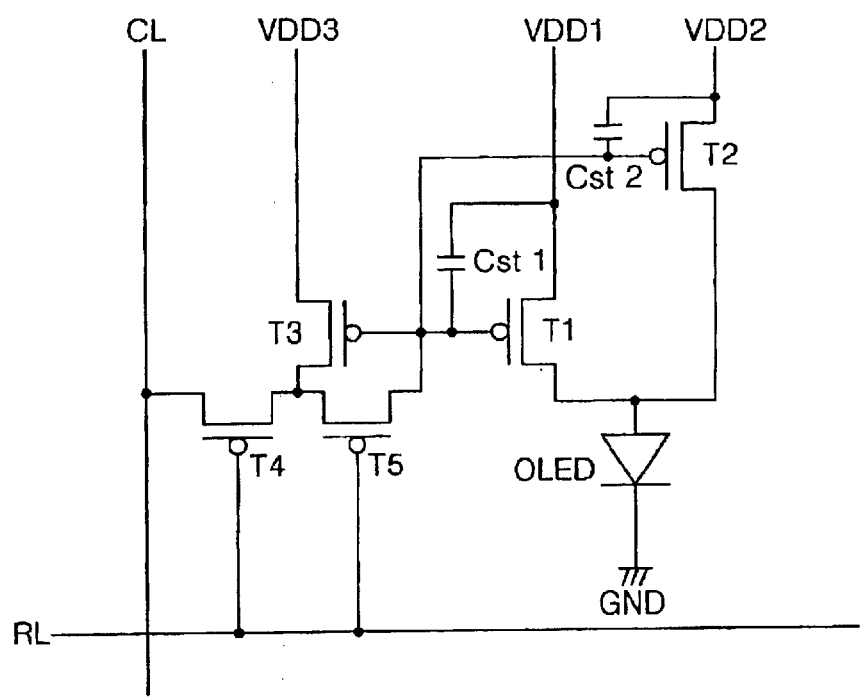
FIG. 13 illustrates an equivalent circuit diagram of the pixels within an organic electro-luminescence device in accordance with a third aspect of the present invention.

FIG. 13 illustrates an equivalent circuit diagram of the pixels within an organic electro-luminescence device in accordance with a third aspect of the present invention.

Referring to FIG. 13, and in accordance with the principles of the third aspect of the present invention, the OELD may generally be provided substantially as the OELD shown in FIGS. 8 and 9 and may include m number of column lines CL1 to CLm, n number of row lines RL1 to RLn, and m×n number of pixels P arranged in a matrix pattern defined by crossings of the column lines CL1 to CLm and the the row lines RL1 to RLn. However, in accordance with the third aspect of the present invention, a cell drive voltage source may include first to third cell drive voltage sources VDD1 to VDD3.

Referring to FIG. 13, and in accordance with the principles of the third aspect of the present invention, each pixel within the OELD may, for example, include switching devices such as a first TFT T1 (e.g., a first driving TFT) formed between the first cell drive voltage source VDD1 and a corresponding electro-luminescence cell for driving the corresponding electro-luminescence cell; a second TFT T2 (e.g., a second driving TFT) formed between the second cell drive voltage source VDD2 and a corresponding electro-luminescence cell for driving the corresponding electro-luminescence cell; a third TFT T3 connected to the third cell drive voltage source VDD3 to form a current mirror with the first and second TFTs T1 and T2; a fourth TFT T4 formed between the third TFT T3, a corresponding column line CL, and a corresponding row line RL to respond to a signal applied by the row line RL; and a fifth TFT T5 connected between the fourth TFT T4 and the first and second TFTs T1 and T2. Further, each pixel within the OELD may include a first capacitor Cst1 connected between the third TFT T3 and the first cell drive voltage source VDD1 and a second capacitor Cst2 connected between the third TFT T3 and the second cell drive voltage source VDD2.

According to the principles of the present invention, any of the first to fifth TFTs T1 to T5 may include amorphous silicon (a-Si) or polycrystalline silicon (p-Si). Further, the first to fifth TFTs T1 to T5 may be provided as p-type or n-type MOS-FET type TFTs. For example, the first to fifth TFTs T1 to T5 shown in FIG. 13, may be provided as p-type TFTs. In one aspect of the present invention, the first and second cell drive voltage sources VDD1 and VDD2 may be connected to each external voltage supply. In another aspect of the present invention, the first and second cell drive voltage sources VDD1 and VDD2 may be alternately driven over consecutive frames. In yet another aspect of the present invention, the third cell drive voltage source VDD3 may be driven in synchrony with the application of a scan voltage from a row line to apply a voltage to the source terminal of the third TFT T3.

According to the principles of the present invention, the fourth and fifth TFTs T4 and T5 may include source, drain, and gate terminals and may be turned on in response to a negative scan voltage applied from the row lines RL1 to RLn. When the fourth and fifth TFTs T4 and T5 are turned on (i.e., when the fourth and fifth TFTs T4 and T5 are maintained in an ON state), electrically conductive paths may be created between the source terminals and corresponding ones of the drain terminals of the TFTs. When the voltage applied from the row lines RL1 to RLn is less than a threshold voltage Vth of the fourth and fifth TFTs T4 and T5, the fourth and fifth TFTs T4 and T5 are turned off (i.e., the fourth and fifth TFTs T4 and T5 are maintained in an OFF state) and electrically conductive paths described above ceases to exist.

In one aspect of the present invention, when the fourth and fifth TFTs T4 and T5 are maintained in their ON states, a data voltage DATA applied from the column lines CL may be transmitted through the fourth and fifth TFTs T4 and T5 to gate terminals of the first and second TFTs T1 and T2. Further, when the fourth and fifth TFTs T4 and T5 are maintained in their OFF states, the data voltage DATA is not applied to the either first or second TFTs T1 or T2.

According to the principles of the present invention, the amount of current conducted between source and drain terminals of the first and second TFTs T1 and T2 may be varied in accordance with the data voltage DATA applied to the gate terminals of the first and second TFTs T1 and T2. Accordingly, the data voltage DATA may control the degree to which the first and second TFTs T1 and T2 apply the first and second cell drive voltage sources VDD1 and VDD2 to the electro-luminescence cell. As a result, the electro-luminescence cells may emit light to a predetermined brightness in accordance with data voltage DATA.

According to the principles of the present invention, the third TFT T3 may be provided as a current mirror with respect to the first and second TFTs T1 and T2 enabling the current within the first and second TFTs T1 and T2 to be uniformly controlled. In one aspect of the present invention, the third cell drive voltage source VDD3 may be connected to the third TFT T3. In another aspect of the present invention, the voltage applied by the third cell voltage source VDD3 may be substantially equal to the voltage applied by the first and second cell drive voltage sources VDD1 and VDD2 to form the current mirror.

According to the principles of the present invention, the first capacitor Cst1 may store a voltage substantially equal to a voltage difference between the data voltage DATA and the first cell drive voltage VDD1 to cause the voltage applied to the gate terminal of the first TFT T1 to be substantially uniformly maintained during one frame period of the OELD while the current is uniformly applied to the electro-luminescence cell during the one frame period.

According to the principles of the present invention, the second capacitor Cst2 may store a voltage substantially equal to a voltage difference between the data voltage DATA and the second cell drive voltage VDD2 to cause the voltage applied to the gate terminal of the second TFT T2 to be substantially uniformly maintained during one frame period of the OELD while the current is uniformly applied to the electro-luminescence cell during the one frame period.

Figure 14:
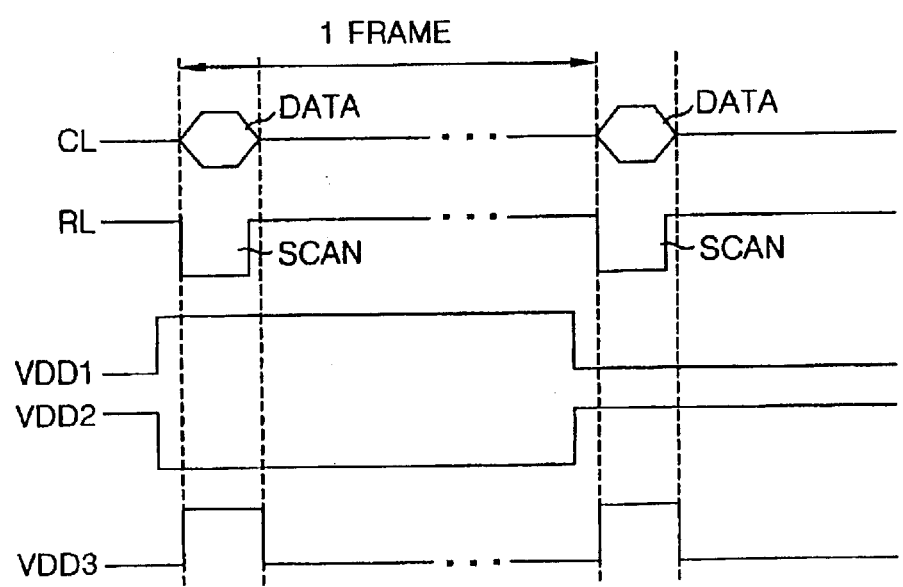
FIG. 14 illustrates scan and data voltage waveforms applied to the electro-luminescence device shown in FIG. 13.

FIG. 14 illustrates scan and data voltage waveforms applied to the electro-luminescence device shown in FIG. 13.

Referring to FIG. 14, scan pulses SCAN having a negative scan voltage may be sequentially applied to the plurality of row lines RL1 to RLn while and the data voltage DATA may be simultaneously applied to each of column lines CL1 to CLm. Further, the data voltage DATA may be applied from the column lines CL1 to CLm in synchrony with the application of each scan pulse SCAN. Accordingly, in each frame, data voltages DATA may be transmitted through the fourth and fifth TFTs T4 and T5 and be charged within the first and second capacitors Cst1 and Cst2. The first and second capacitors Cst1 and Cst2 may each store voltages equal to the voltage difference voltage between the data voltage DATA and the first and second cell drive voltages VDD1 and VDD2, respectively. Therefore, voltages applied to the gate terminals of the first and second TFT T1 and T2 may be substantially uniformly maintained during one frame period while the current is uniformly applied to the electro-luminescence cell during the one frame period.

In one aspect of the present invention, the first and second cell drive voltage source VDD1 and VDD2, connected to respective ones of the source terminals of the first and second TFTs T1 and T2, are alternately driven over consecutive frames. Accordingly, the first and second TFTs T1 and T2 may apply first and second cell drive voltages VDD1 and VDD2 to corresponding electro-luminescence cells, causing the electro-luminescence cells to emit light during each frame. The first and second cell drive voltages may be applied from the first and second cell drive voltage sources VDD1 and VDD2, respectively, before scan pulses SCAN and data voltages DATA are applied from the column lines CL and the row lines RL. Accordingly, the electro-luminescence cell may emit light in response to the first and second cell drive voltages VDD1 and VDD2, alternately applied during each frame. In one aspect of the present invention, the number of column lines CL provided within the OELD may correspond to the number of red (R), green (G), and blue (B) pixel signals that are inputted. In another aspect of the present invention, light emitted from the electro-luminescence cells can be displayed at both an upper and a lower part of the OELD.

As described above, the organic electro-luminescence device (OELD) and the method of driving the same of the present invention may include drive thin film transistors connected in parallel with electro-luminescence cells, wherein deterioration of the thin film transistors that drive the electro-luminescence cells is substantially prevented. Further, capacitors may be connected to each driving thin film transistor such that a voltage substantially equal to a voltage difference between an applied data voltage and an applied cell drive voltage may be stored within the capacitors and uniformly maintained during one frame period of the OELD while the current is uniformly applied to the electro-luminescence cell during the one frame period. Therefore, and in accordance with the principles of the present invention, the organic electro-luminescence device and the method of driving the same may include two driving thin film transistors for driving each electro-luminescence cell, wherein the driving thin film transistors are alternately driven over consecutive frames, thus preventing deterioration of driving thin film transistors driven in the presence of DC voltages over extended periods of time. The strength of a current applied to the organic electro-luminescence cell may be sustained at a high level for long periods of time while extending the effective life of the driving thin film transistors.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electro-luminescence device (OELD), comprising:
   a plurality of column lines for applying data voltages;
   a plurality of row lines crossing the plurality of column lines for applying scan voltages; and
   a plurality of cells formed at pixel areas defined between crossings of the plurality of column lines and row lines, wherein each cell includes:
   a first switching device for controlling a current applied to the cell in response to the data voltage;
   a second switching device connected to the cell in parallel with the first switching device for controlling a current applied to the cell in response to the data voltage;
   a third switching device for transmitting the data voltage applied from the column line to the first and second switching devices in response to a scan voltage; and
   first and second capacitors for storing the data voltages transmitted by the third switching device while maintaining the data voltage for one frame period.

2. The organic electro-luminescence device according to claim 1, further comprising a plurality of cell drive voltage sources for applying cell drive voltages to each of the plurality of cells.

3. The organic electro-luminescence device according to claim 2, wherein the plurality of cell drive voltage sources includes:
   a first cell drive voltage source connected to the first switching device; and
   a second cell drive voltage source connected to the second switching device.

4. The organic electro-luminescence device according to claim 3, wherein the first and second cell drive voltages are directly connected to the first and second switching devices, respectively.

5. The organic electro-luminescence device according to claim 3, wherein the first capacitor is connected between the third switching device and the first cell drive voltage source.

6. The organic electro-luminescence device according to claim 3, wherein the second capacitor is connected between the third switching device and the second cell drive voltage source.

7. The organic electro-luminescence device according to claim 3, wherein cell drive voltages are alternately appliable over consecutive frames by the first and second cell drive voltage sources.

8. The organic electro-luminescence device according to claim 1, wherein the first to third switching devices include thin film transistors (TFTs).

9. The organic electro-luminescence device according to claim 8, wherein the first to third switching devices include MOS TFTs.

10. The organic electro-luminescence device according to claim 9, wherein at least one of the first to third switching devices includes amorphous silicon.

11. The organic electro-luminescence device according to claim 9, wherein at least one of the first to third switching devices includes polycrystalline silicon.

12. The organic electro-luminescence device according to claim 9, wherein the first to third switching devices are n-type MOS TFTs.

13. The organic electro-luminescence device according to claim 9, wherein the first to third switching devices are p-type MOS TFTs.

14. An organic electro-luminescence device, comprising:
a plurality of first column lines for applying a first data voltage;
a plurality of second column lines for applying a second data voltage;
a plurality of row lines crossing the first and second column lines for applying scan voltages; and
a plurality of cells formed at pixel areas defined between crossings of the first and second column lines and the row lines, wherein each cell includes:
a first switching device for controlling a current applied to the cell in response to the first data voltage;
a second switching device for controlling a current applied to the cell in response to the second data voltage;
a third switching device for transmitting the first data voltage applied from the first column line to the first switching device in response to a scan voltage;
a fourth switching device for transmitting the second data voltage applied from the second column line to the first switching device in response to a scan voltage;
a first capacitor for storing the first data voltage transmitted by the third switching device while maintaining the first data voltage for one frame period; and
a second capacitor for storing the second data voltage transmitted by the fourth switching device while maintaining the first data voltage for one frame period.

15. The organic electro-luminescence device according to claim 14, wherein first and second data voltages are alternately appliable to the first and second column lines over consecutive frames.

16. The organic electro-luminescence device according to claim 14, further comprising a cell drive voltage source for applying a cell drive voltage to each of the plurality of cells.

17. The organic electro-luminescence device according to claim 16, wherein the first and second switching devices are connected in parallel between the cell drive voltage source and the cell.

18. The organic electro-luminescence device according to claim 16, wherein the cell drive voltage source is connected to source terminals of each of the first and second switching devices.

19. The organic electro-luminescence device according to claim 16, wherein the first capacitor is connected between the third switching device and the cell drive voltage source.

20. The organic electro-luminescence device according to claim 16, wherein the second capacitor is connected between the fourth switching device and the cell drive voltage source.

21. The organic electro-luminescence device according to claim 14, wherein the first to fourth switching devices include thin film transistors (TFTs).

22. The organic electro-luminescence device according to claim 21, wherein the first to fourth switching devices include MOS TFTs.

23. The organic electro-luminescence device according to claim 22, wherein at least one of the first to fourth switching devices includes amorphous silicon.

24. The organic electro-luminescence device according to claim 22, wherein at least one of the first to fourth switching devices includes polycrystalline silicon.

25. The organic electro-luminescence device according to claim 22, wherein the first to fourth switching devices are n-type MOS TFTs.

26. The organic electro-luminescence device according to claim 22, wherein the first to fourth switching devices are p-type MOS TFTs.

27. An organic electro-luminescence device, comprising:
a plurality of column lines for applying data voltages;
a plurality of row lines crossing the plurality of column lines for applying scan voltages; and
a plurality of cells formed at pixel areas defined between crossings of the column lines and the row lines, wherein the each cell includes:
a first switching device for controlling a current applied to the cell in response to the data voltage;
a second switching device connected to the cell in parallel with the first switching device for controlling a current applied to the cell in response to the data voltage;
a third switching device provided as a current mirror with the first and second switching devices;
a fourth switching device for transmitting the data voltage applied from the column line to the first and second switching devices in response to a scan voltage;
a fifth switching device connected between the fourth, first, and second switching devices for transmitting the data voltage transmitted by the fourth switching device to each of the first and second switching devices, respectively; and
first and second capacitors for storing the data voltage transmitted through the fourth and fifth switching devices while maintaining the first data voltage for one frame period.

28. The organic electro-luminescence device according to claim 27, further comprising a plurality of cell drive voltage sources for applying:
a plurality of drive voltage sources for applying cell drive voltages to each of the plurality of cells.

29. The organic electro-luminescence device according to claim 28, wherein the drive voltage sources includes:
a first cell drive voltage source connected to the first switching device;
a second cell drive voltage source connected to the second switching device; and
a third cell drive voltage source connected to the third switching device.

30. The organic electro-luminescence device according to claim 29, wherein the first to third cell drive voltages are directly connected to the first to third switching devices, respectively.

31. The organic electro-luminescence device according to claim 29, wherein the first capacitor is connected between the third switching device and the first cell drive voltage source.

32. The organic electro-luminescence device according to claim 29, wherein the second capacitor is connected between the third switching device and the second cell drive voltage source.

33. The organic electro-luminescence device according to claim 29, wherein cell drive voltages are alternately appliable over consecutive frames by the first and second cell drive voltage sources.

34. The organic electro-luminescence device according to claim 27, wherein substantially identical cell drive voltages are appliable by the first to third cell drive voltage sources.

35. The organic electro-luminescence device according to claim 25, wherein the first to fifth switching devices include thin film transistors (TFTs).

36. The organic electro-luminescence device according to claim 33, wherein the first to fifth switching devices include MOS TFTs.

37. The organic electro-luminescence device according to claim 36, wherein at least one of the first to fifth switching devices includes amorphous silicon.

38. The organic electro-luminescence device according to claim 36, wherein at least one of the first to fifth switching devices includes polycrystalline silicon.

39. The organic electro-luminescence device according to claim 36, wherein the first to fifth switching devices are n-type MOS TFTs.

40. The organic electro-luminescence device according to claim 36, wherein the first to fifth switching devices are p-type MOS TFTs.

41. A method of driving of an organic electro-luminescence device, comprising:
    providing a plurality of column lines for applying data voltages;
    providing a plurality of row lines for applying scan voltages;
    providing a plurality of cells at pixel areas defined between the column lines and the row lines, wherein each of the plurality of cells includes:
        a first cell drive voltage source and a second cell drive voltage source for driving the cells in response to the data voltage;
        a first switching device for controlling a current applied to the cell in response to the data voltage;
        a second switching device connected in parallel with the first switching device for controlling a current applied to the cell; and
        a third switching device for transmitting a data voltage from the column line to the first and second switching devices;
    alternately applying first and second cell drive voltages from the first and second cell drive voltage sources, respectively, to the cells over consecutive periods;
    applying the data voltages from the column lines; and
    applying the scan voltages from the row lines in synchrony with the data voltages.

42. The method of driving according to claim 41, further comprising:
    providing a first capacitor between the first and third switching devices;
    providing a second capacitor between the second and third switching devices; and
    applying the data voltages to the first and second capacitors to charge the first and second capacitors and maintain the data voltages for one frame period.

43. The method of driving according to claim 42, further comprising causing predetermined ones of the plurality of cells to emit light in correspondence with the first and second cell drive voltages and the applied data voltages.

44. The method of driving according to claim 43, further comprising applying the first and second cell drive voltages prior to application of the data voltages.

45. The method of driving according to claim 43, further comprising alternately applying the first and second cell drive voltages over consecutive frame periods.

46. The method of driving according to claim 45, further comprising causing predetermined ones of the plurality of cells to emit light in correspondence with the data voltages and the alternately applied first and second cell drive voltages.

47. The method of driving according to claim 43, wherein causing predetermined ones of the plurality of cells to emit light includes:
    applying the data voltages charged within the first and second capacitors to the first and second switching devices, respectively;
    determining current path widths of the first and second switching devices by the applied data voltages; and
    applying the first and second cell drive voltages to the cells in accordance with the determined current path widths.

48. A method of driving of an organic electro-luminescence device, comprising:
    providing a plurality of first column lines for applying a first data voltage;
    providing a plurality of second column lines for applying a second data voltage;
    providing a plurality of row lines for applying scan voltages;
    providing a plurality of cells at pixel areas defined between the first and second column lines and the row lines, wherein each of the plurality of cells includes:
        a first switching device for controlling a current applied to the cell in response to the first data voltage;
        a second switching device for controlling a current applied to the cell in response to the second data voltage;
        a third switching device for transmitting the data voltage applied from the first column line to the first switching device;
        a fourth switching device for transmitting the data voltage applied from the second column line to the second switching device;
    alternatively applying the first and second data voltages from the first and second column lines, respectively, over consecutive periods; and
    applying scan voltages from the row lines in synchrony with the first and second data voltages.

49. The method of driving according to claim 48, further comprising:
    providing a first capacitor between the first and third switching devices
    applying the first data voltage to the first capacitor to charge the first capacitor for one frame period; and
    providing a second capacitor between the second and fourth switching devices to charge the second capacitor for one frame period.

50. The method of driving according to claim 49, further comprising causing predetermined ones of the plurality of cells to emit light in correspondence with the first and second data voltages and the applied cell drive voltage.

51. The method of driving according to claim 49, further comprising alternately applying the first and second data voltages over consecutive frame periods.

52. The method of driving according to claim 51, further comprising causing predetermined ones of the plurality of cells to emit light in correspondence with the cell drive voltage and the alternately applied first and second data voltages.

53. The method of driving according to claim 52, wherein causing predetermined ones of the plurality of cells to emit light includes:
    applying the data voltages charged within the first and second capacitors to the first and second switching devices, respectively;
    determining current path widths of the first and second switching devices by the applied first and second data voltages; and
    applying the cell drive voltage to the cells in accordance with the determined current path widths.

54. A method of driving of an organic electro-luminescence device, comprising:

providing a plurality of column lines for applying data voltages;

providing a plurality of row lines for applying scan voltages;

providing a plurality of cells at pixel areas defined between the column lines and the row lines, wherein each of the plurality of cells includes:
  first, second, and third cell drive voltage sources for driving the cells in response to the data voltage;
  a first switching device for controlling a current applied to the cell in response to the data voltage;
  a second switching device connected in parallel with the first switching device for controlling a current applied to the cell;
  a third switching device for forming a current mirror with the first and second switching devices; and
  fourth and fifth switching devices connected in series to each other for transmitting a data voltage applied from the column line to the first and second switching devices, respectively;

alternately applying first and a second cell drive voltages from the first and second cell drive voltage sources, respectively, to the cells over consecutive periods;

applying the data voltages from the column lines;

applying the scan voltages from the row lines in synchrony with the data voltages; and applying a third cell drive voltage from the third cell drive voltage source in synchrony with the data voltages.

55. The method of driving according to claim 54, further comprising:

providing a first capacitor between the first and third switching devices;

providing a second capacitor between the second and third switching devices; and applying the data voltages to the first and second capacitors to charge the first and second capacitors and maintain the data voltages for one frame period.

56. The method of driving according to claim 55, further comprising causing predetermined ones of the plurality of cells to emit light in correspondence with the first and second cell drive voltages and the applied data voltages.

57. The method of driving according to claim 56, further comprising applying the first and second cell drive voltages prior to application of the data voltages.

58. The method of driving according to claim 56, further comprising alternately applying the first and second cell drive voltages over consecutive frame periods.

59. The method of driving according to claim 54, wherein voltages applied from the first to third cell drive voltages are the substantially equal.

60. The method of driving according to claim 58, further comprising causing predetermined ones of the plurality of cells to emit light in correspondence with the data voltages and the alternately applied first and second cell drive voltages.

61. The method of driving according to claim 55 wherein causing predetermined ones of the plurality of cells to emit light includes:

applying the data voltages charged within the first and second capacitors to the first and second switching devices, respectively;

determining current path widths of the first and second switching devices by the applied data voltages; and applying the first and second cell drive voltages to the cells in accordance with the determined current path widths.

* * * * *